United States Patent [19]
Zagar

[11] Patent Number: 5,513,148
[45] Date of Patent: Apr. 30, 1996

[54] SYNCHRONOUS NAND DRAM ARCHITECTURE

[75] Inventor: Paul Zagar, Boise, Id.

[73] Assignee: Micron Technology Inc., Boise, Id.

[21] Appl. No.: 348,552

[22] Filed: Dec. 1, 1994

[51] Int. Cl.[6] ..................................................... G11C 8/00
[52] U.S. Cl. .................... 365/233; 365/236; 365/230.09
[58] Field of Search .............................. 365/189.05, 221, 365/230.03, 230.09, 233, 239, 240, 289.12, 236

[56] References Cited

U.S. PATENT DOCUMENTS

| | | | |
|---|---|---|---|
| 4,602,354 | 7/1986 | Craycraft et al. | 365/189.05 |
| 5,083,296 | 1/1992 | Hara et al. | 365/233 |
| 5,276,642 | 1/1994 | Lee | 365/189.04 |
| 5,287,327 | 2/1994 | Takasugi | 365/230.02 |
| 5,293,346 | 3/1994 | Nakajima et al. | 365/221 |
| 5,305,263 | 4/1994 | Morgan | 365/190 |
| 5,307,314 | 4/1994 | Lee | 365/189.04 |
| 5,311,483 | 5/1994 | Takasugi | 365/233 |
| 5,313,433 | 5/1994 | Waller | 365/230.06 |
| 5,327,390 | 7/1994 | Takasugi | 365/230.06 |
| 5,339,276 | 8/1994 | Takasugi | 365/230.02 |

OTHER PUBLICATIONS

T. Hasegawa, D. Takashima, R. Ogiwara, M. Ohta, S. Shiratake, T. Hamamoto, T. Yamada, M. Aoki, S. Ishibashi, Y. Oowaki, S. Watanabe, F. Masuoka, "An Experimental DRAM with a NAND–Structured Cell", 1993 IEEE International Solid–State Circuits Conference, pp. 46–47.

Primary Examiner—Joseph A. Popek
Attorney, Agent, or Firm—Greg A. Blodgett

[57] ABSTRACT

An integrated circuit memory device has two banks of NAND structured memory cells and a clock input for synchronously latching control, address and data signals. Time delays of sequentially accessing and restoring memory bits in the NAND structure are masked through the use of the dual bank architecture and synchronous timing. The NAND structured memory cells provide an extremely dense memory array for a high capacity memory device. The input clock signal driving a synchronous word line generator provides a simplified high speed access to the array. A set of random access storage registers temporarily store data from the array and provide high speed page access to an entire page of data from each bank of the memory. The ability to access one bank while simultaneously opening or closing a row in the other bank allows for an unlimited number of high speed sequential data accesses.

16 Claims, 6 Drawing Sheets

SYNCHRONOUS NAND DRAM ARCHITECTURE

FIELD OF THE INVENTION

This invention relates to integrated circuit memory device architectures designed to provide high density data storage with high speed read and write data access.

BACKGROUND OF THE INVENTION

The demand for faster, higher density, random access memory integrated circuits is ever present. In the quest to meet this demand, numerous alternatives to the standard DRAM architecture have been proposed. Unfortunately, the higher density and higher speed requirements have largely proven to be mutually exclusive. Circuitry to accelerate data flow tends to add area to the memory device, which in turn adds cost. The higher cost of high speed devices has prevented their wide spread use, and therefore only limited quantities are manufactured. This limited manufacture further prevents the reduction in cost which typically can be accomplished through the manufacturing improvements and efficiencies associated with a high volume product. Ultra dense device architectures often require complex sequences of timing signals to access data in the array. These complex sequences add overhead to the access time creating a relatively slow device. The speed penalties associated with these architectures have likewise prevented their wide spread acceptance. A demand remains for a high speed, high density memory device that can compete with the standard DRAM in terms of the cost of manufacture and ease of use.

SUMMARY OF THE INVENTION

A synchronous NAND type dynamic memory cell is used to provide both high density and high speed access. A dual bank architecture is used to provide continuous sequential access to the array by masking row access and precharge times. The use of a clock input signal significantly simplifies the design of the word line generation circuitry for reading and restoring data in the array. By latching data from the array in temporary high speed random access registers, the data can be rapidly read out of the part either in a random page mode type access, or sequentially through the use of an integrated column address counter. Synchronous data input/output with the clock signal simplifies the interface between the memory and external circuitry, and allows for a high speed data pipeline between the random access registers and the input/output buffers. A programmable burst length counter may be included to allow for a predetermined number of interleaved or linear data accesses.

BRIEF DESCRIPTION OF THE DRAWINGS

The features of the invention as well as objects and advantages will be best understood by reference to the appended claims, detailed description of particular embodiments and accompanying drawings where:

DETAILED DESCRIPTION OF THE PREFERRED EMBODIMENTS

Figure 1:
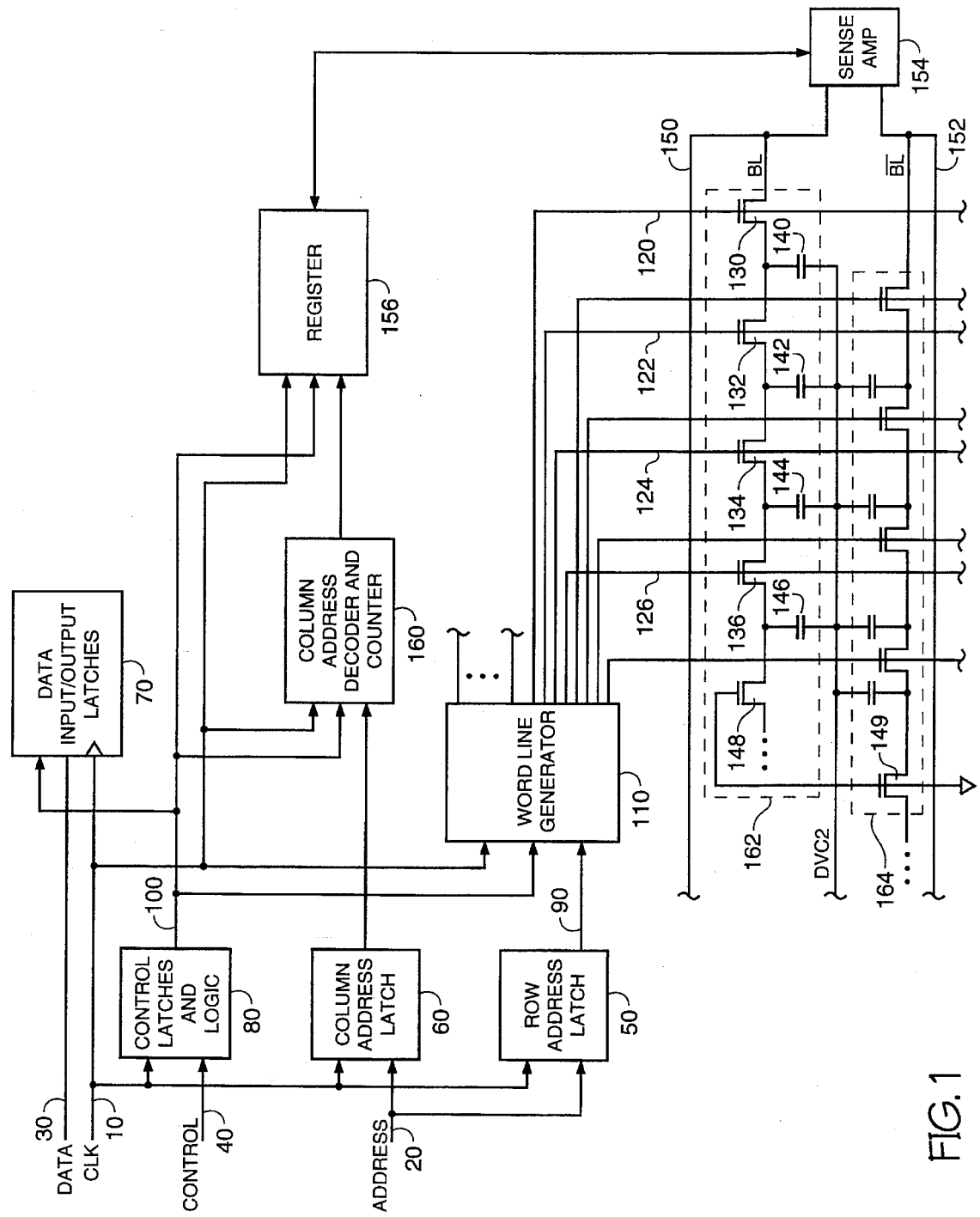
FIG. 1 is an electrical schematic diagram of a memory device in accordance with one embodiment of the invention.

In reference to FIG. 1, a 100 megahertz 16 megabit synchronous NAND dynamic memory device has a clock signal input node 10 for receiving a clock signal which is used to latch address signals at node 20, data signals at node 30 and control signals at node 40 into input latches 50, 60, 70 and 80. The Row Address latch 50 generates a row address at node 90. The clock signal is used with the row address and latched control signals at node 100 as an input to the word line generator 110. When a command is received on the control node 40 to access a row in the memory, the word line generator will activate a series of word lines 120, 122, 124 and 126 which in turn sequentially actuate access devices 130, 132, 134 and 136 sequentially accessing data stored on storage elements 140, 142, 144 and 146. Dummy access devices 148 and 149 are optionally placed between adjacent NAND structures for signal isolation. At the end of a series of NAND structures, the dummy devices may be tied to a reference or supply voltage where they would normally tie into the next NAND structure. Data from the storage elements is detected on bit line 150 using bit line 152 as a reference. Sense amplifier 154 amplifies the differential signal on bit lines 150 and 152. Data read out of the storage elements and amplified in the sense amps is then latched in registers 156. Registers 156 are accessible via the column address decoder/counter 160 which receives an initial column address from the column address latch 60. In burst mode operation, the clock signal causes the column address counter 160 to advance on each clock pulse, or on a multiple thereof. The column address may be advanced in a linear or in an interleaved pattern. Each column address selects a word of data from the registers 156. Data from the registers 156 is latched in the output buffer 70 for data read cycles.

At the end of a memory cycle, either a single or a burst access, a command is sent to close the open row. An open row is one in which the word lines are active and the data from the row is avialable for access. A closed row is one in which the word lines are deactivated, and the data is stored in the memory cell. To close the row, data from the registers 156 is sequentially sent back to the bit line 150 and stored in the storage elements. The word lines 120, 122, 124 and 126 are deactivated in reverse order to trap the restored data in the appropriate storage element. This figure shows only two NAND memory structures 162 and 164 of four bits each to illustrate the function of the invention. The actual 16 megabit device is made up of over four million NAND structures each capable of storing four bits of data. Multiple NAND structures share a common bit line in one dimension of the array, and multiple NAND structures share common word lines in the other dimension. A NOR type memory cell of four bits requiring an active low word line signal activating a p-channel access device could also be used. Additionally, there is no requirement that there be four bits per NAND or NOR memory cell. Other cell capacities greater than a single bit could be used where the number of sequential word lines generated in response to an access command is equal to the number of bits in a NAND or NOR memory cell structure.

Figure 2:
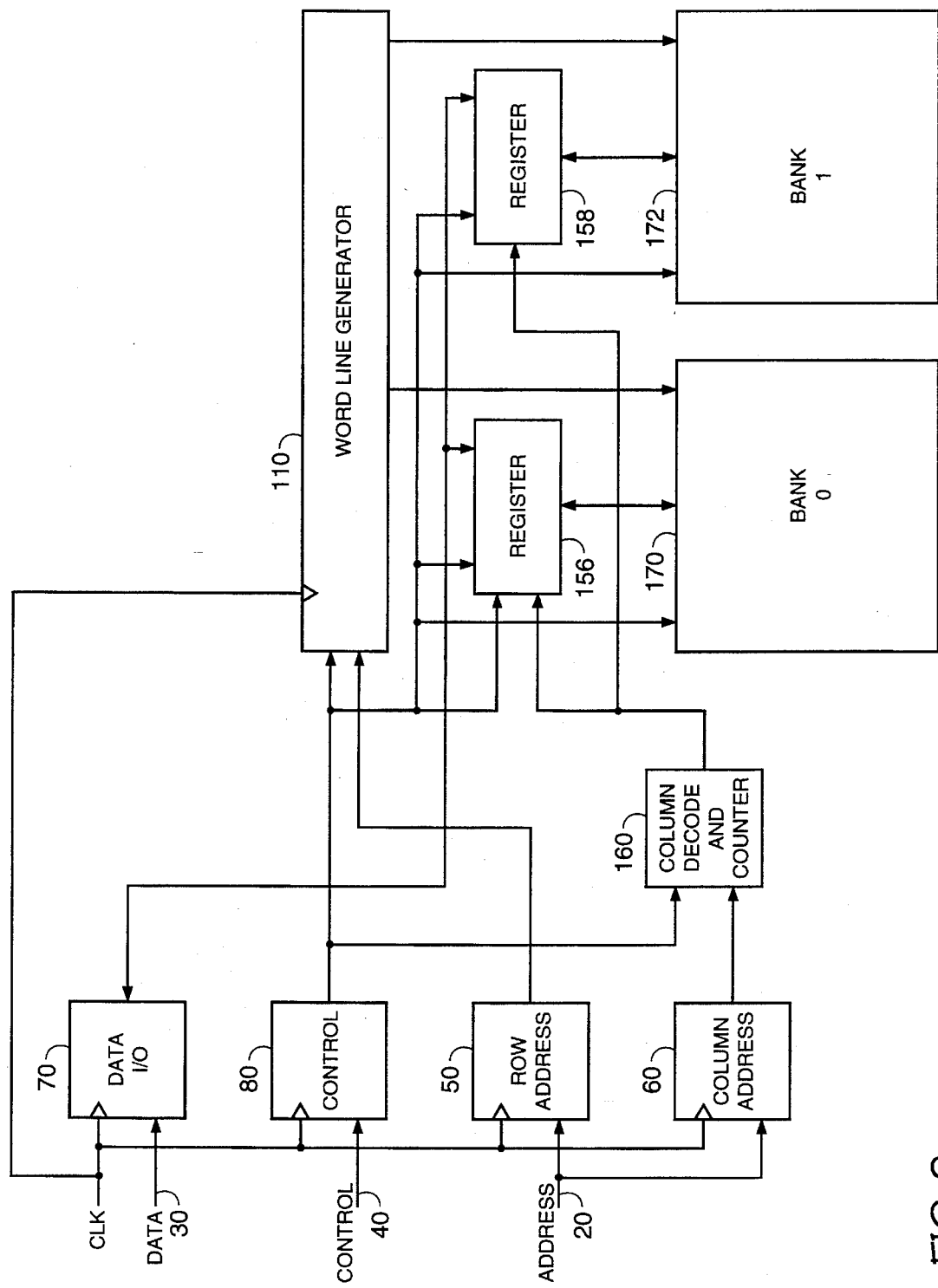
FIG. 2 is an electrical schematic diagram of a memory device in accordance with a further embodiment of the invention.

FIG. 2 shows an alternate embodiment of the invention which has two banks of NAND structured dynamic memory devices 170 and 172. In addition to the two banks, there are two sets of registers 156 and 158, one for each bank of memory. Elements of like function between FIG. 1 and FIG. 2 have corresponding element numbers. Detail of the memory banks is not shown. The memory device of FIG. 2 operates in a similar fashion to the device of FIG. 1 with certain advantages. The two bank device of FIG. 2 provides for continuous data access by allowing a row in one bank to be opened or closed while data is being accessed in the other bank. For example, a burst read cycle can be initiated in bank one. While data is being burst out of bank one, a command to open a row of bank 2 will not interfere with the burst read of bank one. A command to perform a burst read of bank two will terminate the burst read of bank one, and provide data out of bank two. While data is being burst out of bank two, bank one can be instructed to close the open row and open another row without interrupting the data flow from bank two. A burst read can then be performed from bank one which will terminate the read of bank two. Interleaving the banks in this manner provides for high speed uninterrupted data access of the memory device.

Figure 3:
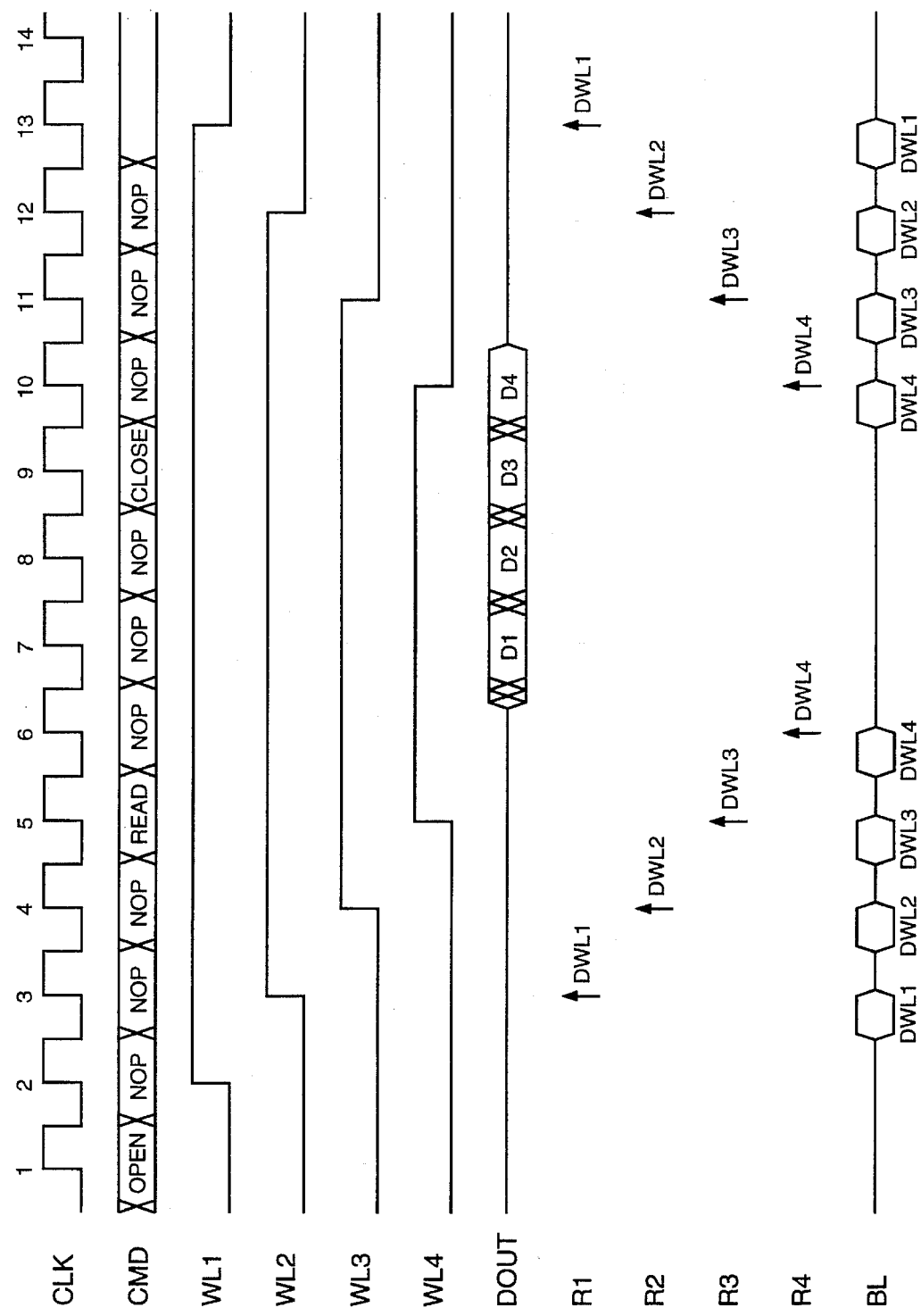
FIG. 3 is a timing diagram of a read operation of a memory device designed in accordance with the embodiment of the invention shown in FIG. 1.

FIG. 3 is a timing diagram showing the synchronous operation of the memory device of FIG. 1 in a read cycle of burst length four. Each clock pulse is numbered for reference. The time between clock pulses is 10 nanoseconds for this example of a 100 megahertz device. At time t=1, a command to open a row of the memory is latched into the control latches, and the row address is latched into the row address latches. At time t=2, the first word line is activated. The second through fourth word lines are activated on successive clock pulses. One clock period after each word line is activated, the data associated with that word line is latched into a register from a bit line. Five clock cycles after receiving the open command, all of the word line data is available in the registers. Four or more clock cycles after receiving the open command, the device is ready to receive a read command and the column address. The first data word corresponding to the column address received with the read command flows through the output buffer after the clock cycle following the read command, in this case time t=6. On the next clock pulse, t=7, the first read data word is valid on the device output pins, and the next read data word is latched in the output buffer. Successive data words are available on successive clock pulses. At time t=9, a command is received to close the open row. At time t=10, the fourth word line is closed trapping data on a bit line from its associated register into a memory cell. Also at time t=10, the last valid read data word is available at the device output pins, and the outputs are turned off before time t=11. At time t=11, the third word line is closed, trapping data on the bit line from the third data register into the third memory cell of the four cell NAND structure. At times t=12 and 13 word lines two and one are closed trapping data from the bit line which carries data from registers two and one sequentially. At time t=13 all data from the registers is restored into the memory cells, and the row is closed.

Figure 4:
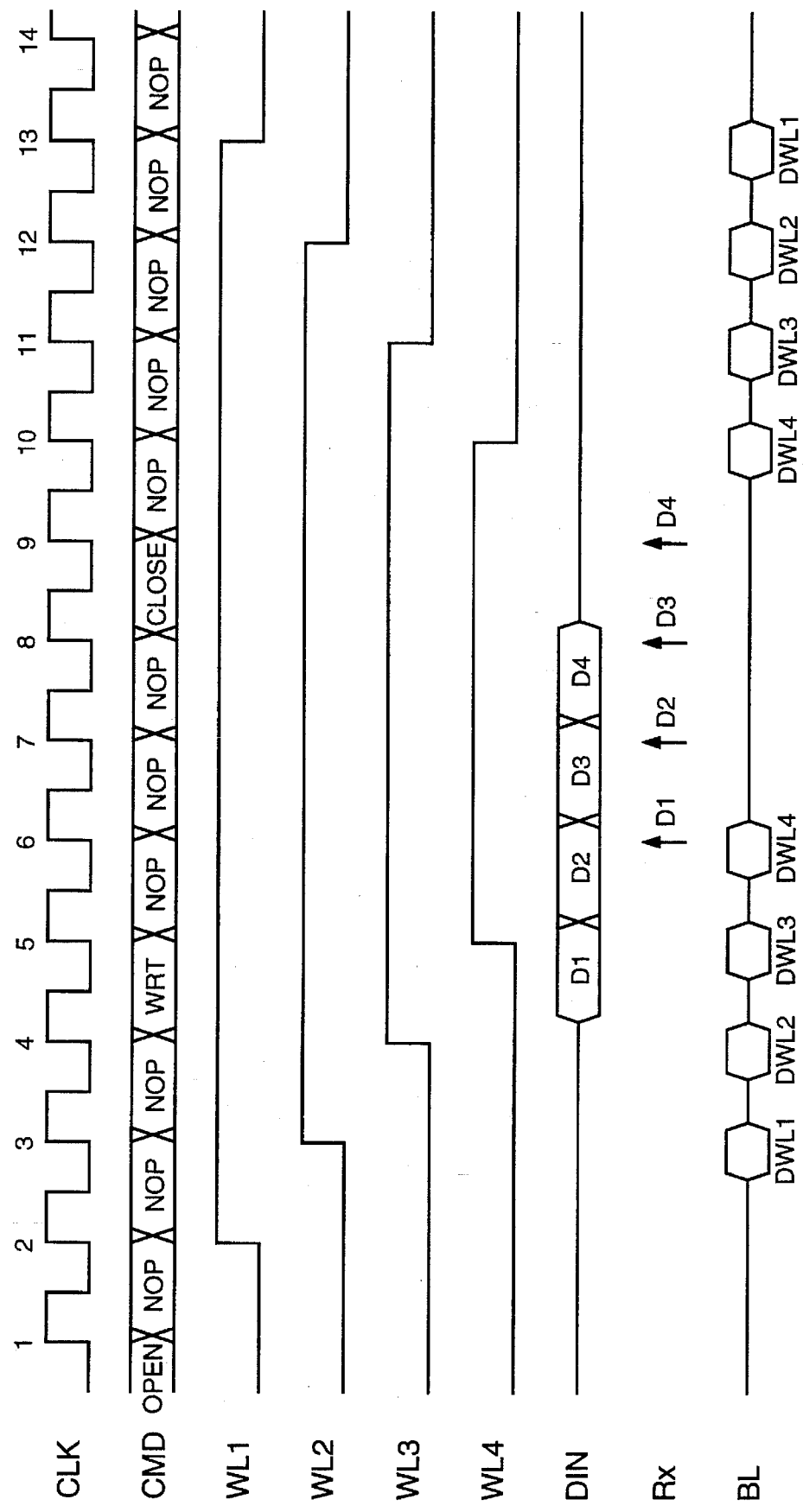
FIG. 4 is a timing diagram of a write operation of a memory device designed in accordance with the embodiment of the invention shown in FIG. 1.

FIG. 4 is a timing diagram showing the synchronous operation of the memory device of FIG. 1 in a write cycle of burst length four. Each clock pulse is numbered for reference. The time between clock pulses is 10 nanoseconds for this example of a 100 megahertz device. At time t=1, a command to open a row of the memory is latched into the control latches, and the row address is latched into the row address latches. At time t=2, the first word line is activated. The second through fourth word lines are activated on successive clock pulses. One clock period after each word line is activated, the data associated with that word line is latched into a register from a bit line. Five clock cycles after receiving the open command, all of the word line data is available in the registers. Four or more clock cycles after receiving the open command, the device is ready to receive a write command and the column address. The first data word corresponding to the column address received with the write command is latched in the data buffer on the clock of the write command, in this case at time t=5. On the next clock pulse, t=6, the first write data word is latched into the appropriate register corresponding to the column address. Also a time t=6, the last of the data words from the memory is latched into the registers. In the event that the first write data is targeted to the same register as the last data from the array, the write data has priority and the array data is prevented from being latched in the register. Otherwise, the first write data will overwrite data in one of the other registers. Successive data words are latched into the registers on successive clock pulses. At time t=9, a command is received to close the open row. Also at time t=9, the last write data word is latched into the registers. At times t=10 through t=13, the word lines are closed in reverse order to trap the data from the registers into the NAND structure as in the case of the burst read of FIG. 3. At time t=13 all data from the registers is restored into the memory cells, and the row is closed.

Figure 5:
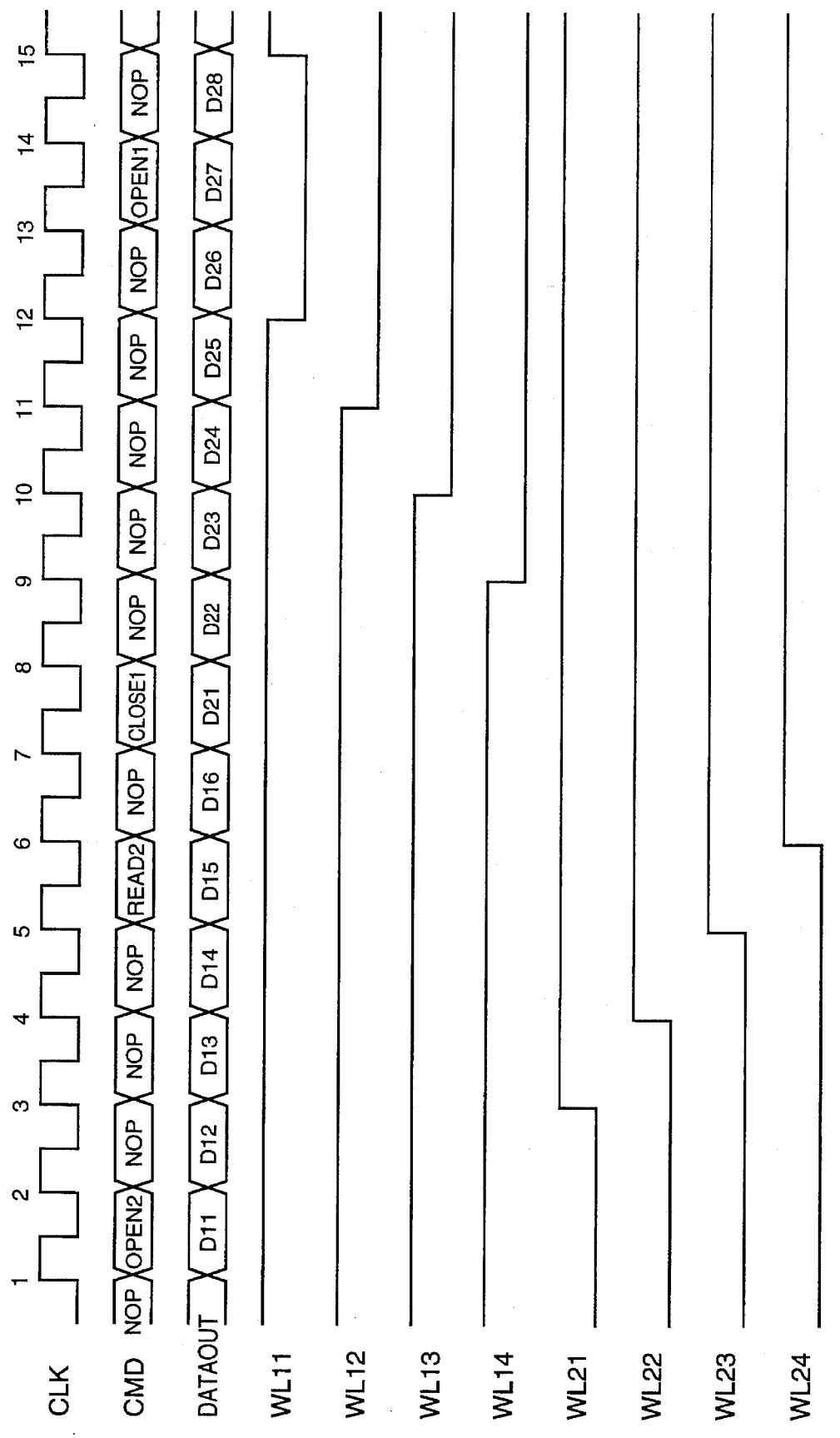
FIG. 5 is a timing diagram of a read operation of a memory device designed in accordance with the embodiment of the invention shown in FIG. 2.

FIG. 5 is a timing diagram showing a dual bank continuous burst read of the memory device of FIG. 2. At time t=1, word lines WL11 through WL14 are high, and a row of bank one is open. Also at time t=1, a burst read of bank one is in progress with data words being output on successive clock cycles. At time t=2, a command to open a row of bank two is received. From time t=2 to time t=7, data from bank two is being accessed and latched in registers. At time t=6, a command is received to perform a burst read from bank two. This read command for bank two terminates the read of bank one with a latency of one clock. At time t=7, the last valid read data word from bank one is available on the device output pins. At time t=8, the first read data from bank two is available. Also at time t=8, a command is received to close bank one. From time t=8 to t=12, data for bank one is restored from the registers into the memory cells while data from bank two is being read. At time t=14 a command is received to open another row of bank one. In this manner a continuous flow of data from the memory can be realized at a high data rate corresponding to the clock frequency.

Dual bank continuous write cycles are performed as detailed in the timing diagram of FIG. 4 with bank switching occurring as detailed in FIG. 5.

Figure 6:
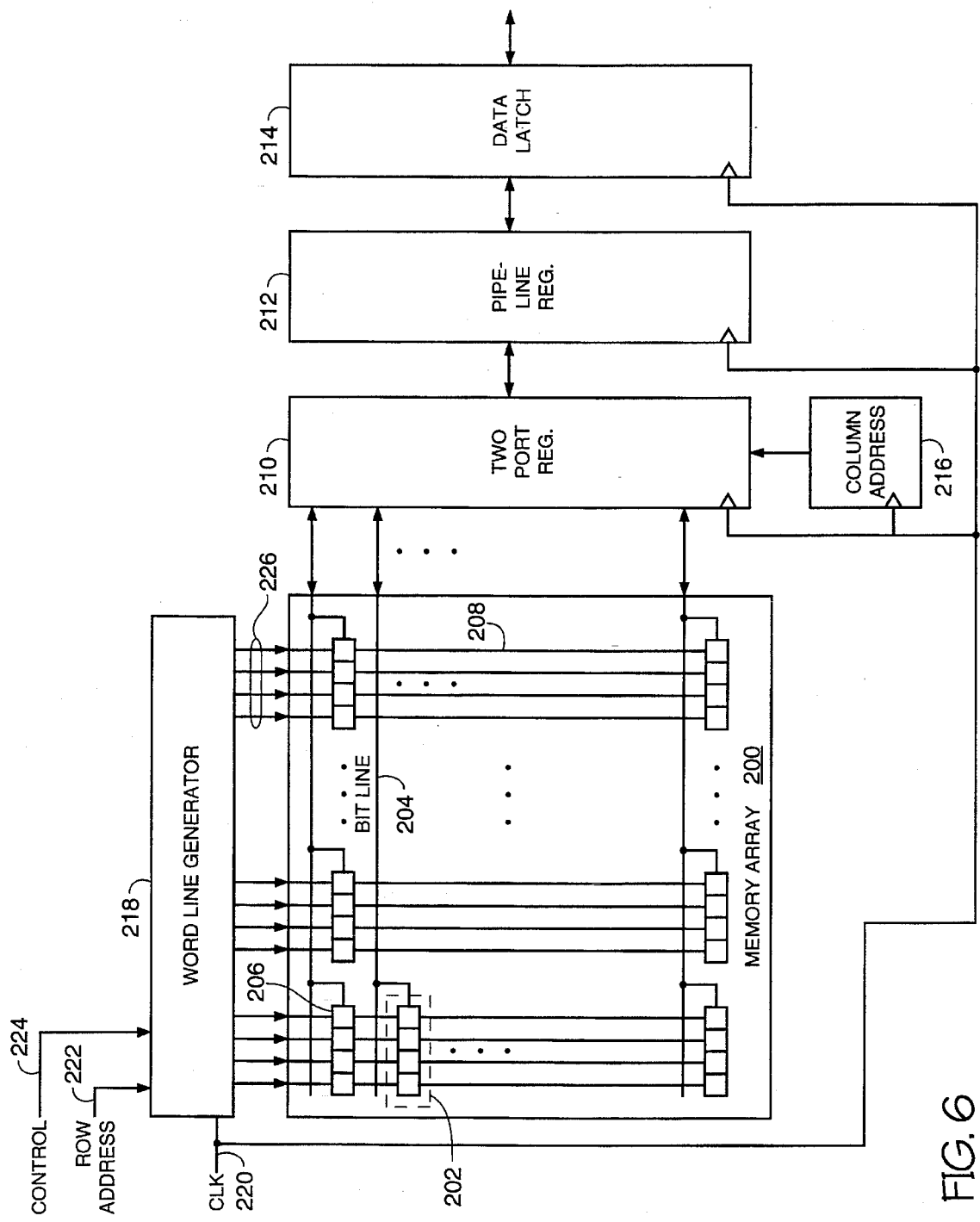
FIG. 6 is a schematic diagram of a memory device designed in accordance with a still further embodiment of the invention.

FIG. 6 shows yet a further embodiment of the invention. In FIG. 6, a two dimensional array 200 of NAND memory cells 202 share a common bit line 204 along one dimension of the array, and bit storage locations 206 of multiple NAND cells share a common word line 208 along the other dimension of the array. Each bit line carries data bidirectionally between the memory array and a two port data register 210. Data transfer between the memory array and the two port data register is accomplished in a serial manner. An optional pipeline register 212 is placed between the two port data register and a data latch 214 for optimum data transfer speed between the two port data register and the data latch. Data transfer between the data latch and the two port data register is accomplished in a random access manner with addresses of the two port data register supplied by a column address counter 216.

In operation, a word line generator 218 receives a clock signal at node 220, a row address at node 222 and control signals at node 224, and activates a series of word lines 226 corresponding to the number of word lines in a memory cell structure at a location determined by the row address. As each word line is activated, a data bit from each of the corresponding memory cells is stored in the two port data register. The data from each memory cell is serially transferred into the two port data register one bit from each cell on each successive clock pulse in which a word line is activated.

For read cycles, data from the two port data register is randomly accessed according to an address from the column address counter. Data from the two port data register is clocked into a pipeline register, and then into the data latch. In a burst read operation, data from sequential column addresses is output through the data latch in successive clock intervals after a latency corresponding to the number of stages in the pipeline, the two port data register and the output latch. The pipeline register may contain multiple stages, some or all of which may alternately be placed between the memory array and the two port data register.

For write cycles, data is latched into the data latch and then through the pipeline into the two port data register, or directly from the data latch into the two port data register when no pipeline stages are between the data latch and the two port data register. Multiple data words may be written into the two port data register at successive clock intervals.

Upon receiving a command to close the row in the memory array, the word line generator will close each of the word lines in reverse order after the appropriate data has been transferred from the two port data register into the memory cells. A delay between receiving the close command and the deactivation of the first row line may be required in the case where a pipeline register is present between the two port data register and the memory array.

A single data latch has been referred to in the description of this embodiment of the invention. However, the data latch may comprise separate input and output latches or a bidirectional latch. This particular embodiment of the invention is also compatible with the dual bank memory device described with reference to FIG. 2. For a multiple bank memory device, multiple two port data registers are required, but they may share common pipeline registers between the two port data registers and the data latch.

Although the present invention has been described with reference to particular embodiments, other versions are possible and will be apparent to individuals skilled in the art. For example, the memory cells of the present invention are not limited to four bit NAND structures. Any NAND or NOR type memory cell structure having a capacity greater than a single bit which requires multiple word lines for data access is applicable. Additionally, rather than activating sequential word lines on successive clock cycles, multiple clock cycles may be required for activation of a word line. Other significant deviations from the timing diagrams and device schematics shown are possible without deviating from the scope and intent of the invention. The invention therefore, is not limited to the specific features and elements shown. It is intended that the scope of the invention be defined by the appended claims and in accordance with the doctrine of equivalents.

What is claimed is:

1. An integrated circuit memory device comprising:
  a) a clock node for receiving a clock signal;
  b) a plurality of latches connected to said clock node for latching address signals, data signals and control signals into the memory device in synchronization with the clock signal;
  c) a data latch connected to said clock node and to an output node of the memory device for latching an output signal to the output node in response to the control signals and in synchronization with the clock signal;
  d) a plurality of word lines;
  e) a word line activation circuit connected to said plurality of word lines, responsive to the control signals and the address signals for activating said plurality of word lines in a sequence;
  f) a NAND structured memory cell connected to said plurality of word lines and to a bit line;
  g) a sense amplifier connected to the bit line; and
  h) a plurality of random access storage registers connected to said sense amplifier and to said data latch.

2. The memory device of claim 1, wherein said plurality of random access storage registers comprises static random access storage cells.

3. The memory device of claim 1, wherein said NAND structured memory cell is one of an array of NAND structured memory cells comprising a plurality of rows and columns of NAND structured memory cells, and said plurality of random access storage registers comprises a register for each data bit in one row of the plurality of rows.

4. The memory device of claim 1, further comprising a column address decode circuit responsive to the clock signal, the control signals and the address signals for selecting a location within said random access storage registers corresponding to an address designated by the address signals, for reading and writing data at the location.

5. The memory device of claim 4, wherein said column address decode circuit further comprises:
  a) a means for receiving the location from the address signals; and
  b) a means for advancing the location in response to the clock signal, thereby selecting a further location within said random access storage registers for reading and writing data.

6. The memory device of claim 1, wherein the control signals and the clock signal determine an access cycle having a beginning and an end, and said word line activation circuit further comprises:
  a means to activate the sequence of word lines in order of least significant to most significant in response to the beginning of the access cycle, and to deactivate the sequence of word lines in order of most significant to least significant in response to the end of the access cycle.

7. An integrated circuit memory device comprising:
  a) a clock node for receiving a clock signal;
  b) an address latch, a data latch and a control latch, each connected to said clock node for latching an address signal, a data signal and control signals respectively in response to transitions of the clock signal;
  c) an output latch connected to said clock node;
  d) a first and second plurality of word lines;
  e) a first bank of NAND structured memory cells connected to said first plurality of word lines and connected to a first bit line;

f) a second bank of NAND structured memory cells connected to said second plurality of word lines and connected to a second bit line;

g) a first word line activation circuit connected to said control latch, said address latch and said first plurality of word lines, responsive to the control signals, the address signal and the clock signal for activating a sequence of said first plurality of word lines;

h) a second word line activation circuit connected to said control latch, said address latch and said second plurality of word lines, responsive to the control signals, the address signal and the clock signal for activating a sequence of said second plurality of word lines;

i) a first plurality of random access storage registers connected to said first bit line, said data latch, said address latch and said output latch; and j) a second plurality of random access storage registers connected to said second bit line, said data latch, said address latch and said output latch.

8. The memory device of claim 7, wherein first data from said first bank of memory cells can be accessed from said first plurality of random access storage registers while second data is being stored into said second bank of memory cells from said second plurality of random access storage registers.

9. A memory device for storing data, comprising:

a) a clock node for receiving a clock signal;

b) an array of serial access memory elements, the array having a first and a second dimension, each of the elements having a plurality of storage cell access devices connected in series;

c) a plurality of word lines, each word line connected to one of the plurality of storage access devices in each of the serial access memory elements along the first dimension of said array;

d) a plurality of bit lines, one bit line of said plurality of bit lines for each of the serial access memory elements along the first dimension of said array connected to each serial access memory element along the second dimension of said array;

e) a two port data register comprising a serial port connected to said array, and a random access port; and f) a data latch connected to an external access point of the memory device and to the random access port of said two port data register, wherein said data latch latches the data from said two port data register into said data latch in synchronization with the clock signal.

10. The memory device according to claim 9, further comprising a pipeline data register electrically interposed between said two port data register and said data latch.

11. The memory device according to claim 9, further comprising a word line activation circuit for synchronously activating a series of word lines in response to the clock signal.

12. The memory device according to claim 9, further comprising:

an address counter for incrementing an address within the memory device in synchronization with the clock signal in order to provide sequential access of the data in synchronization with the clock signal in response to the address and a command to access the data.

13. A method for high speed access of data within a memory device having an array of NAND structured memory cells and input nodes for receiving a clock signal, control signals and address signals, the method comprising:

a) activating a series of word lines of the array whereby a plurality of data bits from a NAND structured memory cell are sequentially transferred onto a bit line;

b) storing the plurality of data bits in a storage register;

c) accessing a first data bit of the plurality of data bits from the storage register in response to the clock signal, the control signals and the address signals;

d) advancing an address counter in response to the clock signal to access a second data bit;

e) accessing a second data bit of the plurality of data bits from the storage register;

f) transferring the plurality of data bits from the storage register onto the bit line; and g) deactivating the series of word lines of the array of memory cells.

14. A method for high speed access of data within a memory device having first and second banks of NAND structured memory cells and input nodes for receiving a clock signal, control signals and address signals, the method comprising:

a) activating a first series of word lines of the first bank of NAND structured memory cells;

b) accessing a first data word from the first bank of NAND structured memory cells in response to the clock, control and address signals;

c) advancing an address counter;

d) accessing a second data word from the first bank of NAND structured memory cells;

e) activating a second series of word lines of the second bank of NAND structured memory cells while data from the first bank of NAND structured memory cells is being accessed; and f) accessing a third data word from the second bank of NAND structured memory cells in response to the clock, control and address signals.

15. The method of claim 14, further comprising:

deactivating the series of word lines within the first bank of NAND structured memory cells while accessing the third data word from the second bank of NAND structured memory cells.

16. The method of claim 16, further comprising:

activating a third series of word lines within the first bank of NAND structured memory cells while accessing a fourth data word from the second bank of NAND structured memory cells.

\* \* \* \* \*